United States Patent [19]
Fleming et al.

[11] Patent Number: 5,916,634
[45] Date of Patent: *Jun. 29, 1999

[54] CHEMICAL VAPOR DEPOSITION OF W-SI-N AND W-B-N

[75] Inventors: James G. Fleming; Elizabeth Lynn Roherty-Osmun; Paul M. Smith; Jonathan S. Custer; Ronald V. Jones, all of Albuquerque, N.M.; Marc-A. Nicolet, Pasadena, Calif.; Roland Madar, Eybens; Claude Bernard, Brie et Angonnes, both of France

[73] Assignee: Sandia Corporation, Albuquerque, N.M.

[*] Notice: Under 35 U.S.C. 154(b), the term of this patent shall be extended for 321 days. This patent is subject to a terminal disclaimer.

[21] Appl. No.: 08/724,341

[22] Filed: Oct. 1, 1996

[51] Int. Cl.$^6$ .................................................. C23C 16/08
[52] U.S. Cl. .................... 427/255.2; 427/255; 427/255.1
[58] Field of Search .............................. 427/255.2, 255.1, 427/255, 314

[56] References Cited

U.S. PATENT DOCUMENTS

| | | | |
|---|---|---|---|
| 4,640,004 | 2/1987 | Thomas et al. | 29/590 |
| 5,254,499 | 10/1993 | Sandhu et al. | 437/192 |
| 5,276,405 | 1/1994 | Doan et al. | 427/126.1 |
| 5,278,100 | 1/1994 | Doan et al. | 437/200 |
| 5,344,792 | 9/1994 | Sandhu et al. | 437/200 |
| 5,369,300 | 11/1994 | Heideman et al. | 257/651 |
| 5,378,501 | 1/1995 | Foster et al. | 427/255.2 |
| 5,416,045 | 5/1995 | Kauffman et al. | 437/174 |

OTHER PUBLICATIONS

Dutron et al, "Morphology and Thermal Stability of M–Si–N (M=Re, W, Ta) for Microelectronics," J. Phys. IV, 5 (C5, Chemical Vapors Deposition, vol. 2), C5/1141–C5/1148, 1995 No Month Data is Available!.

Pierson, "Handbook Of Chemical Vapor Deposition (CVD) Principles, Technology and Applications", Noyes Publications, 1992, pp. 61,148–150 and 247–248. No Month Data is Available!.

Eizenberg, M., et al. "TiCN: A New Chemical Vapor Deposited Contact Barrier Metallization for Submicron Devices," *Appl. Phys. Lett*, vol. 65, No. 19 pp. 2416–2418 (Nov. 7, 1994).

Kolawa, E., et al., "Sputtered Ta–Si–N Diffusion Barriers in Cu Metallizations for Si," *IEEE Electron Device Letters*, vol. 12, No. 6, pp. 321–323, (Jun. 1991).

Kolawa, E., et al., "Amorphous $W_{40}Re_{40}B_{20}$ Diffusion Barriers for (Si)/AL and (Si)/Cu Mettalizations," *Thin Solid Films*, vol. 236 pp. 301–305 (1993) No Month Data is Available!.

Lin, Kun–Chuan, et al., "TiWN Schottky Contacts to n–$Ga_{0.15}In_{0.49}P$," *Jpn. J. Appl. Phys.*, vol. 33, Pt. 1, No. 8, pp. 4546–4549 (1994) No Month Data is Available!.

Reid, J.S., et al, "Thermodynamics of (Cr, Mo, Nb, Ta, V, or W)–Si–Cu Ternary Systems," *J. Mater. Res.*, vol. 7, No. 9, pp. 2424–2428 (Sep. 1992).

Reid, J.S., et al., "Evaluation of Amorphous (Mo, Ta, W)–Si–N Diffusion Barriers for (Si)|Cu Mettalizations," *Thin Solid Films*, vol. 236, pp. 319–324 (1993) No Month data is Available!.

Reid, J.S., et al., "W–B–N Diffusion Barriers for Si/Cu Mettalizations," *Thin Solid Films*, vol. 262, p. 218—(1995) No Month Data is Available!.

Smith, P.M., "Chemical Vapor Deposition of Ternary Refractory Nitrides for Diffusion Barrier Applications," *VMIC Conference*, pp. 162–167 (Jun. 18–20, 1996).

*Primary Examiner*—Roy V. King

[57] ABSTRACT

A method of depositing a ternary, refractory based thin film on a substrate by chemical vapor deposition employing precursor sources of tungsten comprising $WF_6$, either silicon or boron, and nitrogen. The result is a W—Si—N or W—B—N thin film useful for diffusion barrier and micromachining applications.

12 Claims, 7 Drawing Sheets

CHEMICAL VAPOR DEPOSITION OF W-SI-N AND W-B-N

GOVERNMENT RIGHTS

The Government has rights to this invention pursuant to Contract No. DE-AC04-94AL85000 awarded by the U.S. Department of Energy.

BACKGROUND OF THE INVENTION

1. Field of the Invention (Technical Field)

The present invention relates to methods of deposition of thin films for micromachining and diffusion barrier applications, especially for aluminum and copper metallization schemes.

2 Background Art

There is great interest in the deposition of diffusion barriers for both aluminum and copper based metallization schemes. Ternary, refractory based diffusion barriers deposited by physical vapor deposition are excellent diffusion barriers to both copper and aluminum. However, chemical vapor deposition (CVD) has several advantages over physical vapor deposition techniques for industrial applications.

Unlike present titanium based systems which can only be deposited at low temperatures using metalorganic precursors, it is preferred to employ a system in which all the precursors are readily available and accepted by the integrated circuit community.

The present invention has produced a means of depositing recently identified diffusion barrier materials (W—Si—N and W—B—N) by means of CVD. W—Si—N has previously been identified as a potentially useful diffusion barrier and the CVD technique is widely used in the semiconductor industry. However, no one has heretofore demonstrated the ability to use the CVD deposition technique to deposit W—Si—N or W—B—N films or the chemistries used to achieve this end. Properties of the present deposition technique that make it uniquely suited to semiconductor processing are the low deposition temperatures, appropriate deposition rates, and wide process windows.

The semiconductor industry primarily uses three techniques for the deposition of thin films: evaporation, sputtering, and CVD. The following will briefly describe the relative strengths and weaknesses of each of these techniques. Evaporation is a simple and straight-forward technique that allows the deposition of elemental metals. Unfortunately, because evaporation only works reproducibly with elemental films and cannot reliably produce films with more than one constituent (like W—Si—N), it is being used for fewer and fewer applications in the semiconductor industry. Also, evaporation does not provide conformal film coverage over sharp steps (similar to the way snow covers the ground and tops of buildings, but not building walls).

The second technique, sputtering, can produce films with more than one constituent (like W—Si—N), but the conformality remains poor. Sputtering is more complicated than evaporation and, therefore, more expensive, although sputtering allows greater flexibility than evaporation in the composition of the deposited material. It is because of this ability to adjust the composition of the deposited films that sputtering is the most widely used technique for depositing metal films for ULSI applications. Unfortunately, sputtering produces films with poor conformality and there is wide belief that because of this problem sputtering will not be able to provide films for future generations of ULSI devices.

The most complicated of the typical deposition techniques is CVD, although this technique can produce conformal films. In this technique reactive gases are passed over the sample where they react to form a solid film on the sample and volatile by-products that are pumped out of the reaction chamber. The complications caused by the reactive gases are many, including the safety issues involved with handling and disposing of the gases, the requirement for precise flow control of the gases over the sample, and corrosion of parts that come in contact with the gases. Because of these problems CVD is more difficult and expensive than evaporation or sputtering and is used only in applications where good film conformality is required, such as the deposition of $SiO_2$ over metal lines.

Diffusion barriers are used extensively in the semiconductor industry as part of the metallization scheme for ULSI devices. The diffusion barrier that is most widely used today is sputtered TiN, a polycrystalline material that must be 50 to 100 nm thick in order to provide sufficient barrier properties for present ULSI applications. In the future, thinner diffusion barriers will be required that can provide sufficient barrier properties at thicknesses of 10 to 30 nm (considerably less than the thickness of 30 atoms). These new barrier requirements will mean that TiN cannot be used as the diffusion barrier for future ULSI devices and will also mean that variations in the film thickness (poor conformality) will not be acceptable.

A new class of diffusion barriers has been identified by researchers at the California Institute of Technology (Caltech). This class is of amorphous refractory ternary films, such as W—Si—N, Ti—Si—N, and Ta—Si—N. These barriers have been shown to be effective at thicknesses of approximately 10 nm, the thickness that the semiconductor industry needs for future applications. However, the barrier materials developed at Caltech have been deposited by sputtering and not CVD.

The present invention is of CVD deposition techniques for W—Si—N and W—B—N. The chemistry allows the deposition of W—Si—N and W—B—N at temperatures, times, etc., that are attractive to the semiconductor industry, and circumvents the limitation of the prior sputtering deposition techniques of these films.

References related to the present invention include: U.S. Pat. No. 5,278,100, to Doan et al. (Ti—Si—N deposition by CVD); U.S. Pat. No. 5,369,300, to Heideman et al. (amorphous W—Si deposition by sputtering); U.S. Pat. No. 5,376,405, to Doan et al. (Ti—Si deposition by CVD); U.S. Pat. No. 5,416,05, to Kauffman et al. (CVD of TiN); U.S. Pat. No. 5,254,499, to Sandhu et al. (CVD of TiN); U.S. Pat. No. 5,378,501, to Foster et al. (CVD of TiN); U.S. Pat. No. 4,640,004, to Thomas et al. (use of refractory nitrides as blanket layer); Reid et al., "W—B—N Diffusion Barriers for Si/Cu Metallizations", Thin Solid Films 262:218 (January 1995) (sputtered W—B—N); Lin et al., "TiWN Schottky Contacts to n-$Ga_{0.51}In_{0.49}P$", Japanese *Journal of Applied Physics* 33:4546–49 (August 1994) (sputtering of Ti—W—N); Eizenberg et al., "TiCN: A new chemical vapor deposited contact barrier metallization for submicron devices", *Applied Physics Letters* 65:2416–18 (November 1994) (CVD of Ti—C—N); Reid et al., "Evaluation of amorphous (Mo, Ta, W)—Si—N diffusion barriers for <Si>|Cu metallizations", *Thin Solid Films* 236:319–24 (January 1993) (sputtering of (Mo, Ta, W)—Si—N); Kolawa et al., "Amorphous $W_{40}Re_{40}B_{20}$ diffusion barriers for <Si>/Al and <Si>/Cu metallizations", *Thin Solid Films* 236:301–05 (January 1993) (sputtering of W—Re—B); Reid et al., "Thermodynamics of (Cr, Mo, Nb, Ta, V, or W)—Si—Cu ternary systems", *Journal of Materials Research* 7:2424–28 (September 1992) (thermodynamic study of metal-Si—Cu ternary systems); and Kolawa et al., "Sputtered Ta—Si—N Diffusion Barriers in Cu Metallizations for Si", *IEEE Electron Device Letters* 12:321–23 (June 1991) (sputtered Ta—Si—N).

SUMMARY OF THE INVENTION (DISCLOSURE OF THE INVENTION

The present invention is of a method of depositing a ternary, refractory based thin film on a substrate (and the thin film so deposited), comprising: providing a precursor source of tungsten; providing a precursor source of silicon or boron; providing a precursor source of nitrogen; and depositing, by chemical vapor deposition employing the three precursors, a thin film which is either W—Si—N and W—B—N. In the preferred embodiment, the invention also provides substantially inert carrier gas, preferably argon. The source of tungsten is preferably $WF_6$, the source of silicon $SiH_4$ or $Si_2H_6$, the source of boron $B_2H_6$, and the source of nitrogen $NH_3$. The deposition preferably occurs at a temperature between about 200 degrees C. and about 400 degrees C., and most preferably at approximately 350 degrees C. The film deposited preferably has a step coverage of the substrate of greater than approximately 80 percent, most preferably of approximately 100 percent, and a resistivity of between approximately 200 and 20,000 $\mu\Omega$-cm. The film is substantially uniform through its bulk, and preferably comprises between approximately 20 percent and 60 percent tungsten.

A primary object of the present invention is to provide a CVD method of depositing W—Si—N and W—B—N as diffusion barriers for copper and aluminum based metallization schemes.

A primary advantage of the present invention is that it achieves high conformality and step coverage characteristics not possible with physical deposition techniques such as sputtering.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS (BEST MODES FOR CARRYING OUT THE INVENTION)

As semiconductor device dimensions shrink, new diffusion barriers are required. Amorphous refractory ternaries have been identified as promising barrier candidates based on experiments on sputtered films. Because sputtering may not meet future requirements the present invention is of chemical vapor deposition processes for certain of these materials. Acceptable deposition rates are found for each of these processes at 350° C., with all depositions performed between 300 and 450° C. The first CVD process of the invention produces a range of W—Si—N film compositions from $WF_6$, $Si_2H_6$, and $NH_3$. The resistivities vary with composition from 350 to 20,000 $\mu\Omega$-cm. The step coverage obtained is 100% on reentrant 0.25 $\mu$m features with aspect ratios of 4.0. The second CVD process of the invention employs $WF_6$ (reduced by $SiH_4$), $B_2H_6$, and $NH_3$ to produce W—B—N films with a range of compositions. Resistivities range from 200 to 20,000 $\mu\Omega$-cm. The step coverage obtained is about 40% on 1.5 $\mu$m features with aspect ratios of 5.5.

Depositions are preferably conducted on bare silicon, oxide coated wafers, on patterned structures, or on other desired surfaces. The depositions are best performed between 300 and 450° C., with the typical deposition temperature being 350° C.

The W precursor is preferably $WF_6$, but other precursors known in the art may be employed. For the W—Si—N films, the $WF_6$ is preferably mixed with a combination of $Si_2H_6$, $NH_3$, and Ar, but other precursors and dilutant gases may be employed. The Ar flow is typically about 300 sccm and the $WF_6$ flow is typically from about 5 to about 20 sccm. The $NH_3$ and $Si_2H_6$ flows preferably vary between about 10 and about 150 sccm. The W—B—N films are preferably produced with $WF_6$ and a combination of $SiH_4$, $NH_3$, 30% $B_2H_6$ in $N_2$, and Ar. The Ar, $WF_6$, and $SiH_4$ flows are typically about 200, 5, and 3 sccm respectively. The $NH_3$ and $B_2H_6$ flows vary between 10 and 70 sccm.

Figure 1:
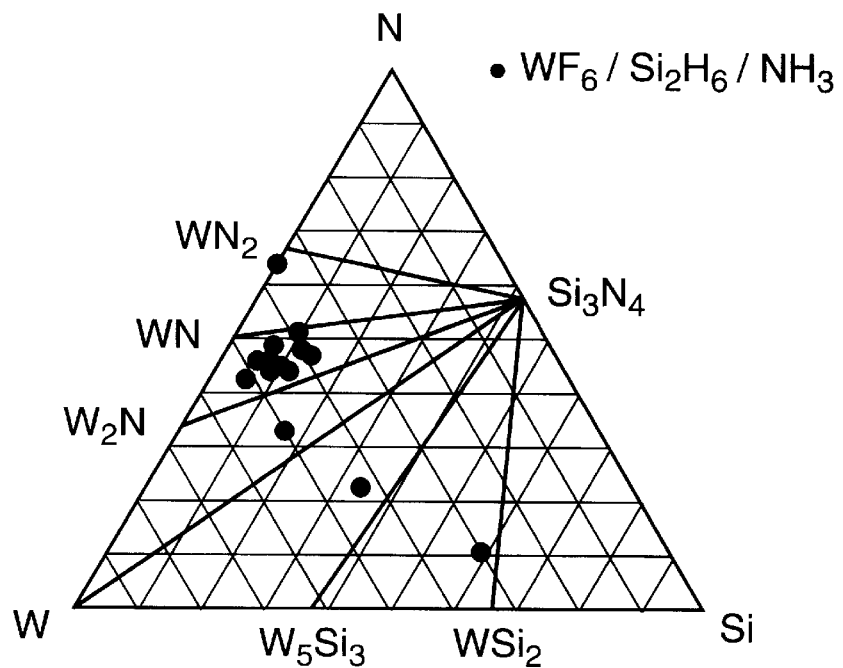
FIG. 1 is a ternary phase diagram of W—Si—N compositions achieved according to the CVD method of the invention.
Figure 2:
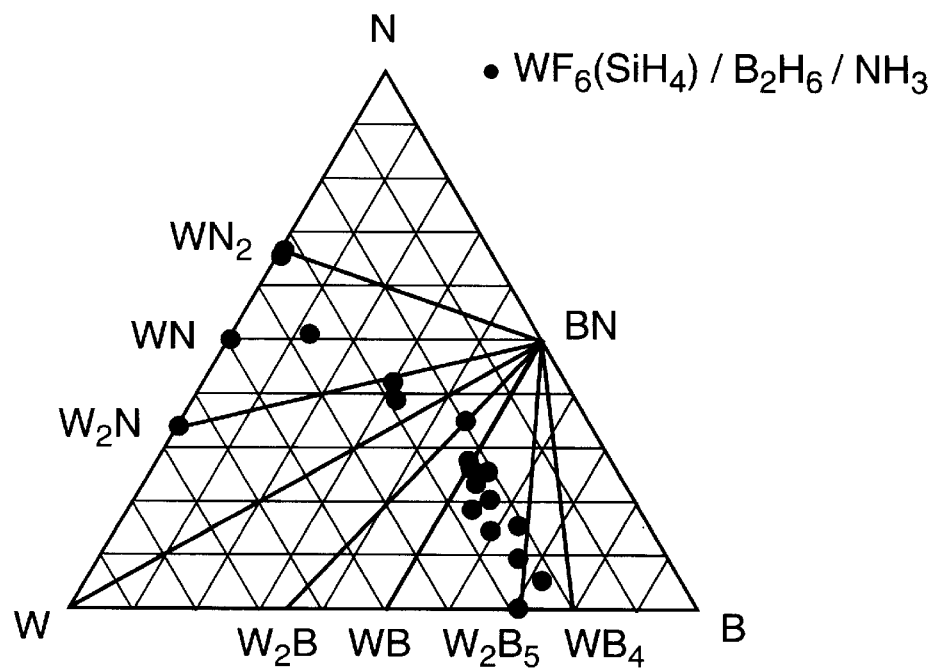
FIG. 2 is a ternary phase diagram of W—B—N compositions achieved according to the CVD method of the invention.
Figure 3:
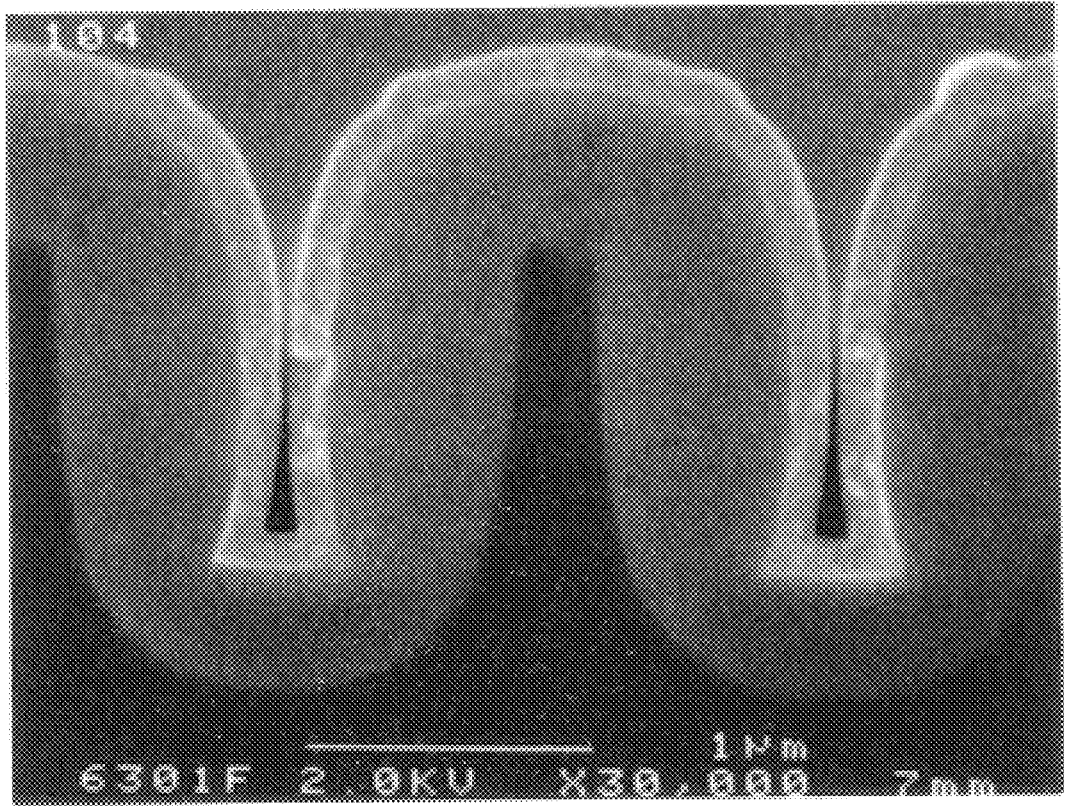
FIG. 3 illustrates the 100% conformality of a W—N—Si film grown according to the invention over 0.25 $\mu$m reentrant features with an aspect ratio of 4:1.

FIGS. 1 and 2 show example film compositions obtainable for W—Si—N and W—B—N systems according to the invention. The exemplary W—Si—N compositions are indicated on the ternary phase diagram of FIG. 1. In general, increasing $NH_3$ (or other nitrogen source) flow reduces the amount of Si incorporated in the film. Tungsten may be incorporated into the W—Si—N films through the reduction of $WF_6$. Thermodynamics predicts that $Si_2H_6$ is the preferred reductant in the gas mixture and also acts as the source of Si in the films. No significant amounts of Si are incorporated into the films using SiH$_4$ as a reductant in the presence of significant NH$_3$ partial pressure and typically produce films with a composition corresponding to WN$_2$. Nitrogen may be incorporated through the reaction of NH$_3$ with W on the growing surface. The deposition rates of W—Si—N films range from 5 to 500 nm per minute, with films deposited from high Si$_2$H$_6$ and lean NH$_3$ mixtures having the highest deposition rates. The as-deposited W—Si—N films have resistivities ranging from 350 $\mu\Omega$-cm for films close to WN to about 20 m$\Omega$-cm for WN$_2$ films. As seen in FIG. 3, step coverage of the exemplary W—Si—N film shown is exceptional. The step coverage is 100%, even on extremely aggressive structures with reentrant features and about 4:1 aspect ratios at 0.25 $\mu$m. The film composition in this case is W$_{0.46}$Si0.08N$_{0.46}$ and the resistivity is 450 $\mu\Omega$-cm. Since step coverage of aggressive features is one of the major problems with most other diffusion barrier systems, this is an important feature. This effect is probably due to adsorption of NH$_x$ fragments on the film surface, lowering the sticking coefficients of the other gas phase components.

The W—B—N film compositions are indicated on the ternary phase diagram of FIG. 2. Even though the temperature is relatively low, there is little H incorporation in the films, typically about 5 at. %, as determined by elastic recoil detection (ERD). In general, increasing the partial pressure of either B$_2$H$_6$ or NH$_3$ increases the fraction of the appropriate element in the film. The deposited ternary compositions lie in a band roughly between 20 and 40 at. % W. Tungsten is preferably incorporated into the films through the reduction of WF$_6$. Thermodynamics predicts that SiH$_4$ is the preferred reductant in the gas mixture. The ratio of WF$_6$ to SiH$_4$ is greater than one, and Si incorporation is typically less than 5 at. %. Because B$_2$H$_6$ is unstable at room temperature, B was probably incorporated into the films through simple decomposition of B$_2$H$_6$, possibly catalyzed by the presence of W. Nitrogen is preferably incorporated through the reaction of NH$_3$ with W on the hot wafer surface. At the lowest temperature, 200° C., the deposited films are unstable in air, possibly due to the presence of unreacted B or boron hydrides.

The W—B—N deposition rates range from 50 to 200 nm per minute. The rate increases with lower flows of NH$_3$ and higher flows of B$_2$H$_6$ and SiH$_4$. Step coverage is about 40% on samples with aspect ratios of 5.5 and 1.5 $\mu$m diameter. The film composition in this case is W$_{0.24}$B$_{0.66}$N$_{0.10}$ and the resistivity is approximately 1400 $\mu\Omega$-cm. The as-deposited films have resistivities ranging from 200 $\mu\Omega$-cm for WB$_x$ rich films, to about 20 m$\Omega$-cm for WN$_x$ rich films. In general, ternary films with a higher fraction of WN$_x$ display a higher resistivity.

Thermal CVD of W—Si—N and W—B—N films is possible with low impurity content. The preferred precursors are all readily available and generally accepted. The resistivities attainable with each system extend well below 1000 $\mu\Omega$-cm, which is generally identified as the value required for future diffusion barrier applications. The step coverage measured for these systems ranges from generally good (for W—B—N) to exceptional (for W—Si—N). The deposition temperatures of 350° C. preferred for these systems is also generally accepted to be low enough for most envisioned barrier applications.

The method of the invention is further useful for producing thin films useful in a variety of applications. In addition to diffusion barrier applications, the invention will be quite useful in production of tribological coatings for micromachining application, including for wear resistance and reducing friction.

Industrial Applicability:

The invention is further illustrated by the following non-limiting examples.

Example 1

CVD Deposition of W—Si—N Diffusion Barriers

Chemical vapor deposition was used to grow ternary tungsten based diffusion barriers to determine if they exhibit properties similar to those of sputter deposited ternaries. A range of different W—Si—N compositions were produced. The deposition temperature was low, 350° C., and the precursors used are accepted by the industry. Deposition rates are acceptable for a diffusion barrier application. Resistivities range from 350 to 20,000 $\mu\Omega$-cm, depending on composition. Step coverage of films with compositions expected to be of interest for diffusion barrier applications is 100%.

Sputtering and chemical vapor deposition techniques are so dissimilar that it was unclear whether or not the excellent barrier characteristics of sputtered ternary refractory alloys would also be displayed by films deposited by CVD. Due to the relatively more complex nature of the CVD process, it was also unclear that compositions useful for diffusion barrier and micromachining applications could be obtained using this technique.

Six inch wafers were used throughout this work. Depositions were conducted on plasma-enhanced CVD oxide, or on step coverage test structures. The deposition system was a simple, cold wall, load locked, single wafer reactor. The tungsten precursor was WF$_6$, which was mixed with a combination of SiH$_4$, or Si$_2$H$_6$ and NH$_3$. Argon was used as a dilutant gas. The Ar and WF$_6$ flows were typically 300, and 5 to 20 sccm respectively. The NH$_3$ and Si$_2$H$_6$ flows were varied between 10 and 150 sccm. Silane flow varied from 0 to 50 sccm. The gases were distributed through separate injection rings spaced 4 inches above the surface of the wafer. The deposition pressure was typically 500 to 700 mTorr. The system was pumped using an oil based mechanical pump. The wafer temperature was 350° C. The composition of the films was determined by Rutherford backscattering spectrometry (RBS) with 3.5 MeV He and elastic recoil detection (ERD) using 28 MeV Si. RBS. Surface morphology and film thickness were determined by SEM. Sheet resistivites were determined with a four point probe. Step coverage was investigated using trench structures cut into the Si substrate which were subsequently oxidized to increase the feature aspect ratio.

Figure 4:
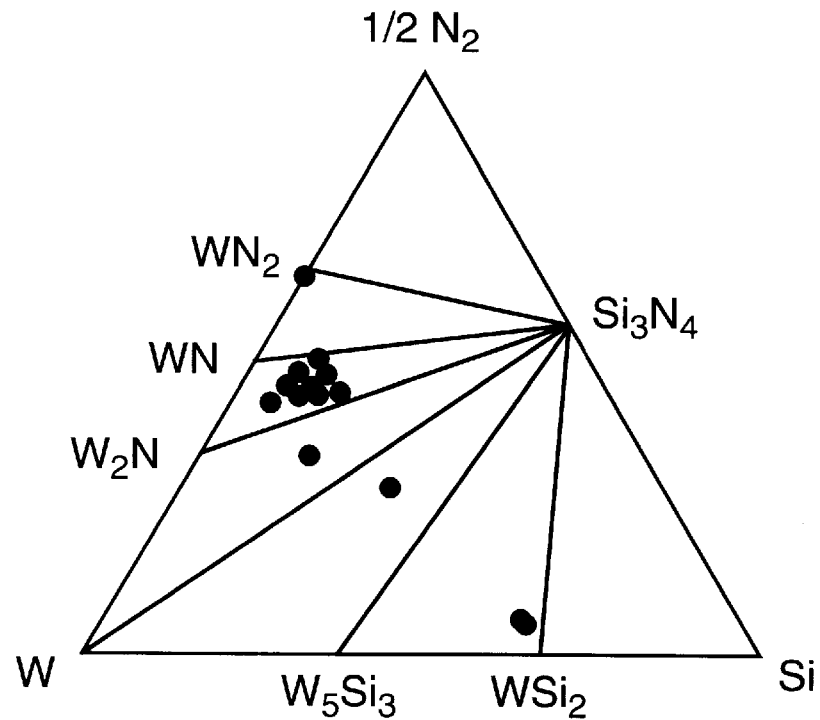
FIG. 4 illustrates the surface morphology of a typical W—Si—N film grown according to the invention.

Tungsten was incorporated into the films through the reduction of WF. Thermodynamics predicts that disilane is the preferred reductant in the gas mixture. The disilane also acts as the source of silicon in the films. The experimenters were unable to incorporate any silicon into the film using silane as a reductant. The films grown by silane reduction, in the presence of NH$_3$, typically had a stoichiometry corresponding to WN$_2$. Nitrogen was incorporated through the reaction of ammonia with tungsten on the growing surface. The deposition rates are adequate for a diffusion barrier application, ranging from 50 to 5000 Å per minute depending on the inlet flow conditions. Films deposited from high disilane and lean NH$_3$ mixtures having the highest deposition rates. The films were typically featureless both visually and under SEM examination, even when relatively thick, as shown in FIG. 4. The exception to this were films with composition close to WSi$_2$ which were rough and possibly porous. The color of the films ranged from steel-gray to brown-gray.

The compositions grown are indicated on the W—Si—N ternary phase diagram in FIG. 1. In general, increasing the NH$_3$ flow reduced the amount of silicon incorporated in the film. However, this effect was complicated by an undesirable side reaction between WF$_6$ with NH$_3$ on the cooled shower head and other parts of the chamber. The product of this reaction is a solid adduct. Because of this, increasing the WF$_6$ flow had the side effect of reducing the NH$_3$ activity over the wafer. The extent of the side reaction also seemed to depend on the condition of the chamber. This problem can be addressed by improving the gas delivery and pumping systems. When the NH$_3$ flow is sufficiently high, WN$_2$ is produced. On the other hand, if no NH$_3$ is present, WSi$_x$ is formed. Even though the temperature used was relatively low, there was little hydrogen incorporation in the films, typically <5 at % as determined by ERD.

Figure 5:
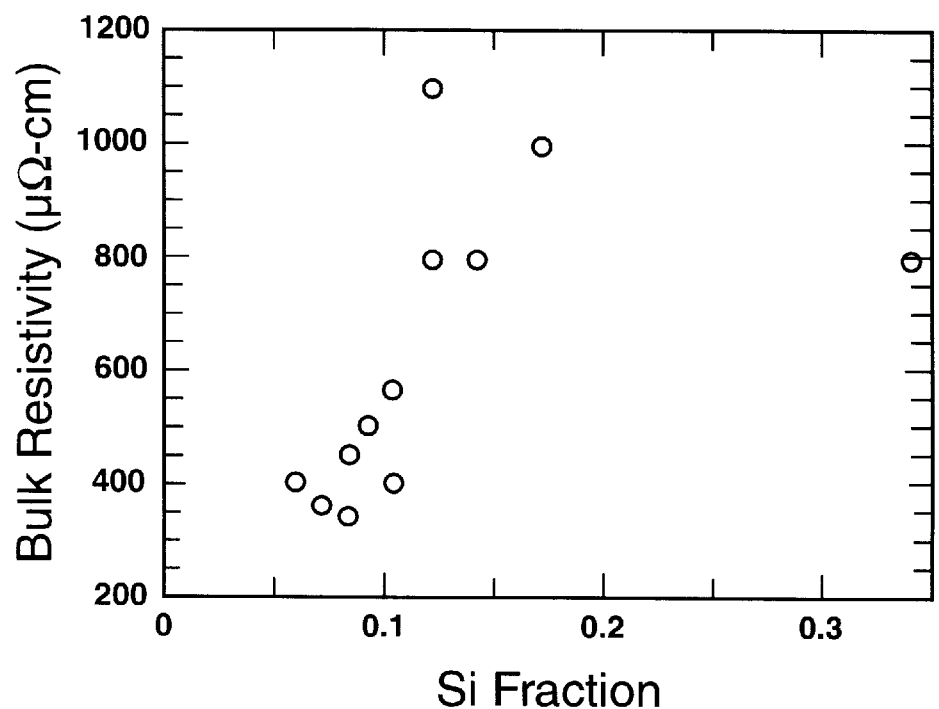
FIG. 5 is a graph of film resistivity versus fraction Si in W—Si—N films grown according to the invention.

The as-deposited films have resistivities ranging from 350 $\mu\Omega$-cm for films close to WN to about 20,000 $\mu\Omega$-cm for films close to WN$_2$. The film resistivity appears to be determined by which tie triangle the composition lies in, and on the silicon concentration for compositions within a tie triangle. FIG. 5 shows how the resistivity of the films change with the fraction of silicon in the film. The compositions between 5 and 15% silicon lie within the W$_2$N—WN—Si$_3$N$_4$ tie triangle and within this range of compositions the resistivity increases with increasing silicon fraction. However, as the silicon fraction is increased further the compositions fall within other tie triangles. For example with 34% Si, the composition moves into the W—Si$_3$N$_4$—W$_5$Si$_3$ tie triangle and the resistivity falls to well below the value that would be predicted purely from the trend observed between 5 and 15% silicon incorporation. This is probably due to the presence of the more conductive W and W$_5$Si$_3$ phases present in this tie triangle. A similar effect may also occur for the composition with 17% Si which lies within the W$_2$N—W—Si$_3$N$_4$ tie triangle, however the trend in this case is masked by the experimental error. In cases where an insufficient partial pressure of Si$_2$H$_6$ was present, films with stoichiometry corresponding to WN$_2$ were grown. These films lie well outside the W$_2$N—WN—Si$_3$N$_4$ tie triangle and have resistivities of about 20000 $\mu\Omega$-cm.

Adhesion of the films to thermal and PECVD oxides appears to be good for most compositions, especially when compared to CVD tungsten films. The films passed the "scratch scotch tape" test and there was no sign of peeling with time. Exceptions to this were WSi$_2$ rich films which peeled spontaneously when about 2000 Å thick.

Step coverage is exceptional, 100% even on extremely aggressive test structures with overhanging features and about 4:1 aspect ratios at 0.25 micron, as shown in FIG. 3. The film composition in this case was W$_{46}$Si$_8$N$_{46}$. The film resistivity was 450 $\mu\Omega$ cm. Since step coverage of aggressive features is one of the major problems with most other diffusion barrier systems this was an extremely encouraging result. The experimenters currently attribute this effect to adsorption of NH$_x$ fragments on the surface lowering the sticking coefficients of the other gas phase components. This lowering of the sticking coefficient would also account for the low efficiency of the reaction.

A range of different W—Si—N compositions were produced using CVD. The deposition temperature was low, the precursors used are well accepted by the industry and the deposition rates are sufficient for a diffusion barrier application. Film resistivities ranged from 350 to 20000 $\mu\Omega$-cm, depending on the composition. Adhesion to plasma enhanced oxide layers was good. The step coverage of the films was exceptional. Ternary films with similar composition deposited by sputtering display excellent barrier properties, and therefore the films produced by the experiment are expected to display properties as good or better.

Example 2

CVD Deposition of W—B—N Diffusion Barriers

A range of different W—B—N compositions in a band of compositions roughly between 20 and 40% W were produced. The deposition temperature was low, 350° C., and the precursors used are well accepted by the industry. Deposition rates were high for a diffusion barrier application. Resistivities ranged from 200 to 20000 $\mu\Omega$-cm, the films with the best barrier properties having about 1000 $\mu\Omega$-cm resistivities. Adhesion to oxides was sufficient to allow these films to be used as the adhesion layer in a tungsten chemical mechanical polishing plug application. The films were x-ray amorphous as deposited and have crystallization temperatures of up to 900° C. Barrier performance against Cu was tested using diode test structures. A composition of W$_{.23}$B$_{.49}$N$_{.28}$ was able to prevent diode failure up to a 700° C., 30 minute vacuum anneal. These materials, deposited by CVD, display properties similar to those deposited by sputtering.

Six inch wafers were used throughout this work. Depositions were conducted on either thermal oxide, plasma-enhanced CVD oxide or on diode, step coverage, or chemical mechanical polishing test structures. The deposition system was a simple, cold wall, load locked, single wafer reactor. The tungsten precursor was WF$_6$, which was mixed with a combination of SiH$_4$, NH$_3$, and 30% B$_2$H$_6$ in N$_2$. Argon was used as a carrier gas. The Ar, WF$_6$ and SiH$_4$ flows were typically 200, 5, and 3 sccm respectively. The NH$_3$ and B$_2$H$_6$ flows were varied between 10 and 70 sccm. The gases were distributed through separate injection rings spaced 4 inches above the surface of the wafer and were allowed to mix only in the low pressure reaction chamber. The deposition pressure was typically 500 to 700 mTorr. The system was pumped using an oil based mechanical pump. The wafer temperature was typically 350° C. The composition of the films was determined by RBS, ERD and SIMS. Surface morphology and film thickness were determined by SEM. Sheet resistivites were determined with a four point probe. The junctions of the diode test structures were formed by implanting 8×1015 As+ cm2 into a 30 $\Omega$ cm, 10 $\mu$m p-type epitaxial layer. The junction depth and area are 280 nm and 250 $\mu$m×250 $\mu$m. The chemical mechanical polishing test structure consisted of a series of via arrays of various sized holes on a variety of pitches patterned through PECVD oxide down to silicon. Following deposition of the thin film W—B—N diffusion barrier/adhesion layer, 8000 Å of CVD tungsten was deposited at 430° C. The wafers were then chemically mechanically polished using a commercially available slurry and tool.

Tungsten was incorporated into the films through the reduction of WF$_6$. Thermodynamics predicts that silane is the preferred reductant in the gas mixture. The ratio of WF$_6$ to SiH$_4$ was greater than 1, and Si incorporation was typically less than 5 atomic percent. Due to the instability of B$_2$H$_6$, it is believed that boron was incorporated into the films through simple decomposition of B$_2$H$_6$, possibly catalyzed by the presence of tungsten. Nitrogen was incorporated through the reaction of ammonia with tungsten on the hot wafer surface.

Figure 6:
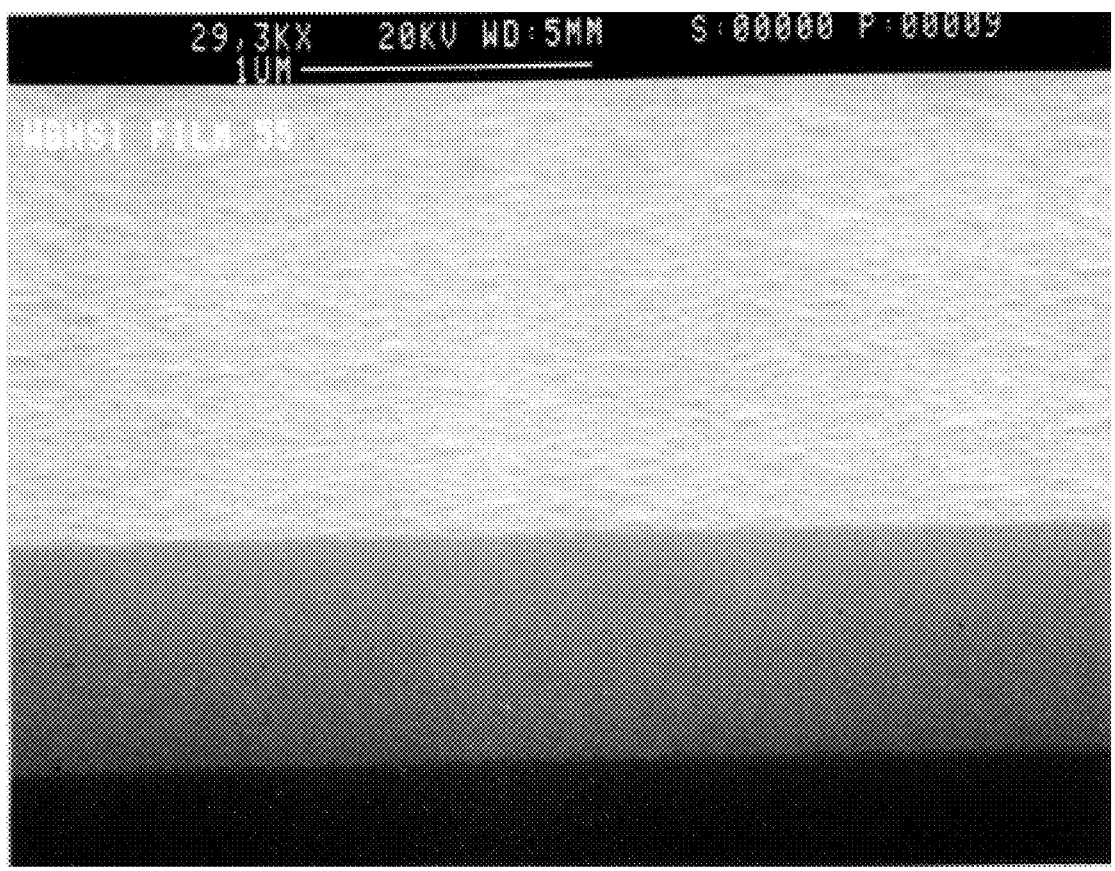
FIG. 6 illustrates the surface morphology of a typical W—B—N film grown according to the invention.

The deposition rates were high for a diffusion barrier application, ranging from 500 to 2000 Å per minute. The rate increased with lower flows of ammonia and higher flows of diborane and silane. The films were featureless both visually and under SEM examination, even when one micron thick, as shown in FIG. 6. The films were steel-gray to brown-gray in color.

Figure 7:
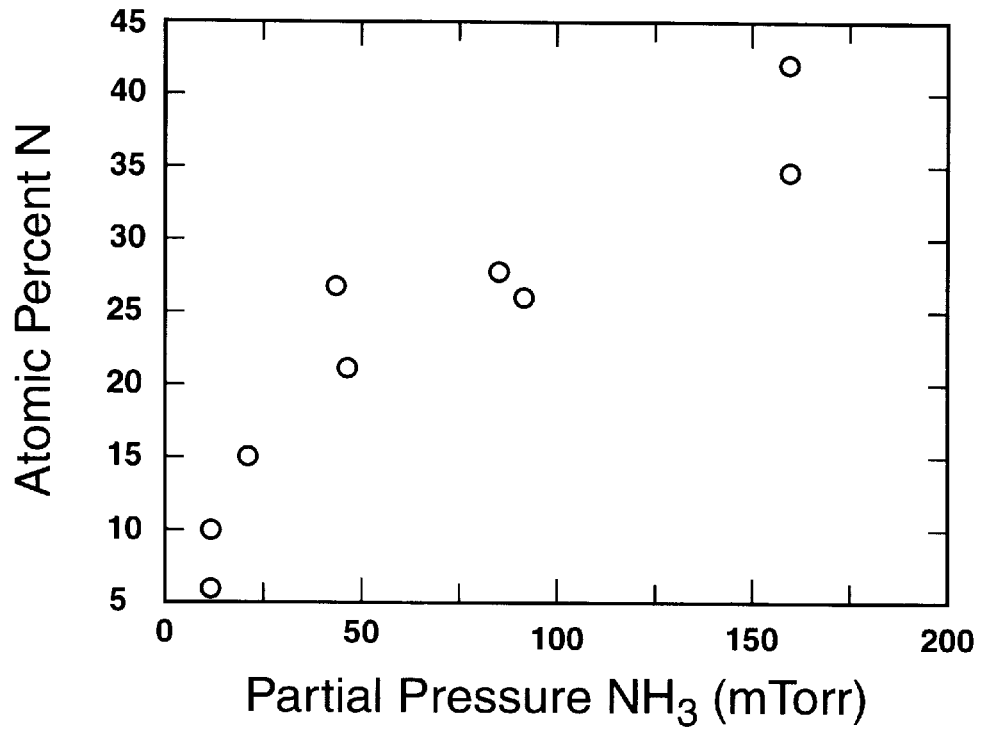
FIG. 7 is a plot of fraction N in W—B—N films grown according to the invention as a function of ammonia partial pressure.

The compositions grown are indicated on the W—B—N ternary phase diagram of FIG. 2. Even though the temperature used was relatively low, there was little hydrogen incorporation in the film, typically about 5% as determined by ERD. The experimenters were able to deposit ternary compositions lying in a band roughly between 20 and 40% tungsten. In general, increasing the partial pressure of either $B_2H_6$ or $NH_3$ increased the fraction of the appropriate element in the film. FIG. 7 demonstrates this in a plot of fraction N in the film as a function of $NH_3$ partial pressure. Step coverage was about 30% on samples with aspect ratios of 4.5 and 1 micron diameter. However, the deposition conditions were not optimized for step coverage and it is believed that the very high surface area (about 450 cm$^2$) of the test structure used may have degraded the step coverage.

Figure 8:
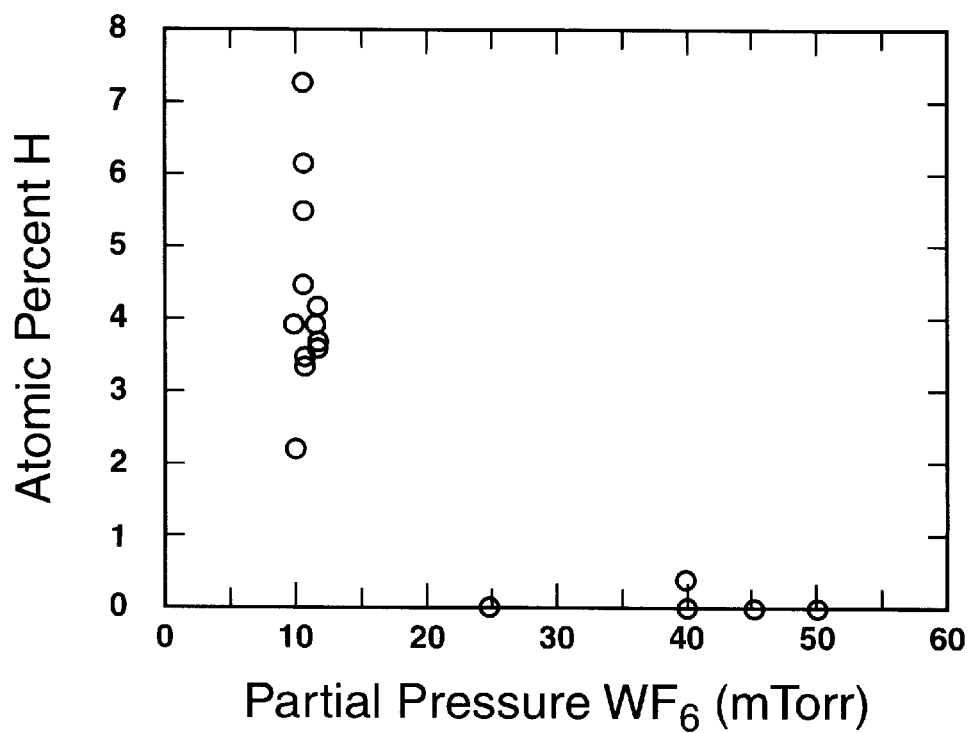
FIG. 8 is a plot of %H in W—B—N films grown according to the invention as a function of $WF_6$ partial pressure.

The experimenters were unable to increase the tungsten fraction in the film by either increasing the $WF_6$ partial pressure by a factor of eight or by varying the temperature from about 200° C. to about 400° C. At the lowest temperature, the deposited films were unstable in air, possibly due to the presence of unreacted boron or boron hydrides. The exact reason for this restriction in the range of W fraction is unknown, though there is some evidence that it is related to the surface character of the growing film. FIG. 8 shows the atomic percent of hydrogen in the growing film as a function of $WF_6$ partial pressure. Films grown under conditions of higher $WF_6$ partial pressure had no detectable levels of hydrogen and under these conditions the experimenters were unable to grow the ternary, growing instead either W or the binaries. Because H is found in the ternary films deposited under lower $WF_6$ partial pressure conditions, it is believed that the surface of these growing layers is less densely fluorine terminated. However, as the $WF_6$ partial pressure is increased, it is believed that the surface becomes fully F terminated. It is inferred from this that growth of the ternary may be affected by the nature of the surface termination.

Both SIMS and RBS indicated that the films were uniform through their bulk. The as-deposited films are x-ray amorphous. However, FTIR transmission peaks associated with B—N bonding were found using FTIR on samples less than 500 Å in thickness.

Figure 9:
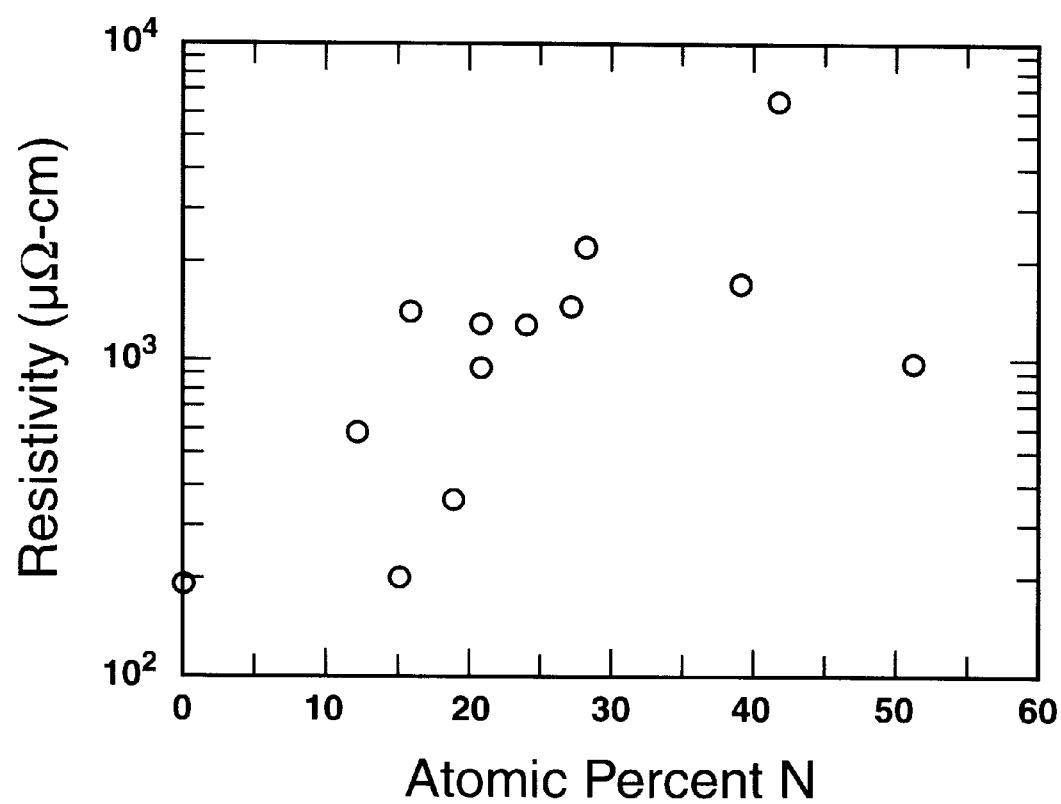
FIG. 9 is a plot of resistivity as a function of N in W—B—N films grown according to the invention.

The as-deposited films have resistivities ranging from 200 $\mu\Omega$-cm for $WB_x$ rich films, to about 20000 $\mu\Omega$-cm for $WN_x$ rich films. Films of intermediate composition with good barrier properties typically had resistivities of about 1000 $\mu\Omega$-cm. In general, ternary films with a higher fraction of $WN_x$ displayed higher resistivities. Resistivity is plotted as a function of fraction N in the film in FIG. 9.

Figure 10:
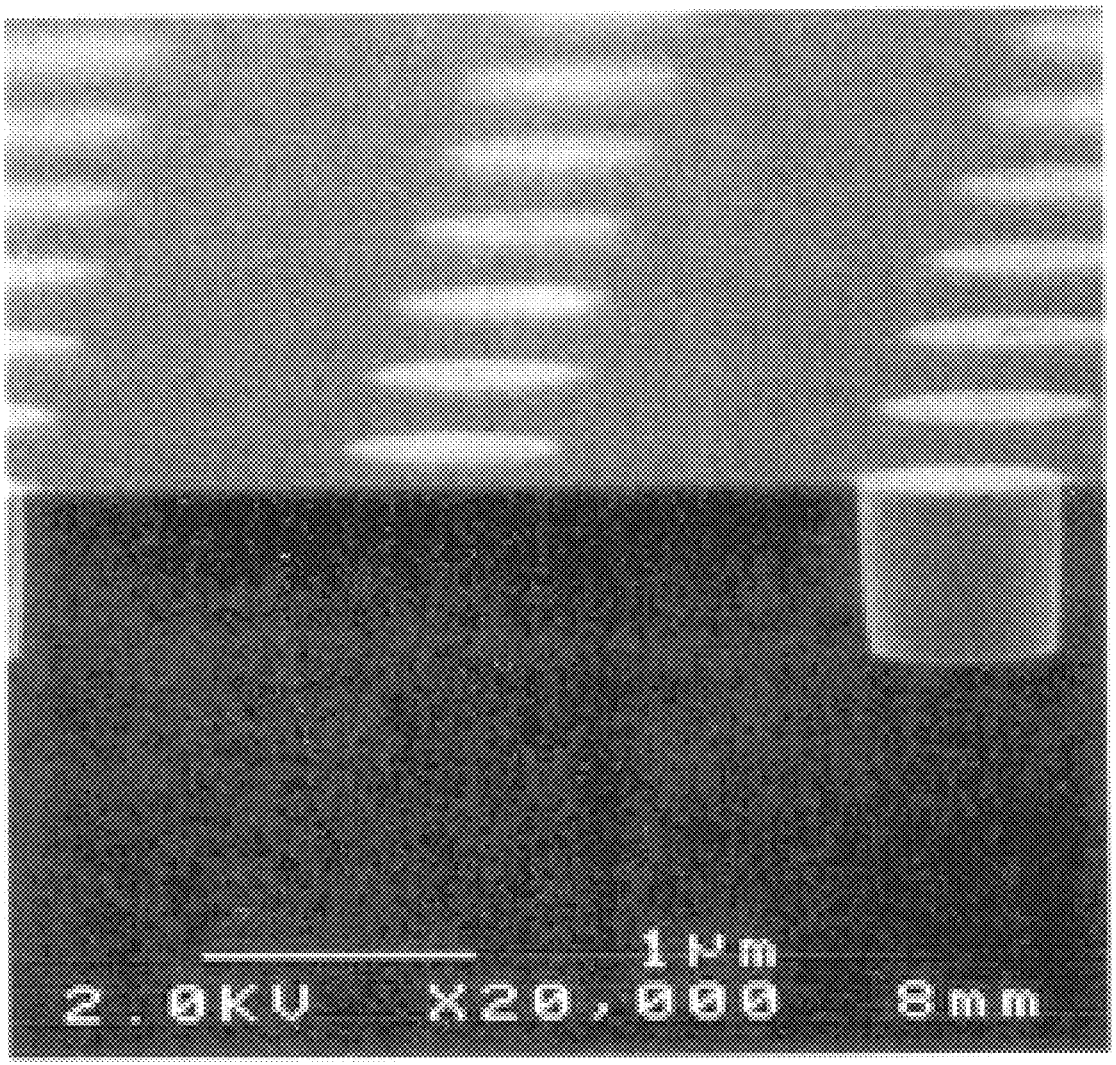
FIG. 10 illustrates Tungsten plugs formed by chemical mechanical polishing using W—B—N grown according to the invention as an adhesion-barrier layer.

Adhesion of the films to thermal and PECVD oxides appears to be acceptable for most compositions. Unlike Ti based materials, the tungsten is unable to reduce the silicon dioxide to improve film adhesion. Bonding in this case may be the result of either B—O or Si—N interactions. As a practical test of adhesion, the experimenters deposited about 1000 Å thick intermediate ternary compositions on a test structure consisting of arrays of holes of varying diameter and pitch. This was immediately followed by the deposition of 8000 Å hydrogen reduced W grown at 3 Torr and 430° C. The tungsten and adhesion layer was then chemically mechanically polished back to the oxide. The end result is shown in FIG. 10. There was no plug loss, however, there was some delamination observed in the approximately 200 $\mu$ wide streets between hole arrays.

Assuming that crystalline diffusion barriers fail by the diffusion of species along grain boundaries, then a rough measure of the effectiveness of these as-deposited amorphous layers is their crystallization temperature. According to Read camera x-ray diffraction, the as-deposited films are x-ray amorphous. Table 1 gives the crystallization temperatures of a range of compositions.

TABLE 1

| Composition | Diode Temp. (30 min. Vs. Cu) | Crystallization Temp. (1 hour anneal) |
|---|---|---|
| $W_{.21}B_{.63}N_{.16}$ | <600 | <700 |
| $W_{.26}B_{.59}N_{.15}$ | <600 | |
| $W_{.24}B_{.66}N_{.10}$ | >600 | |
| $W_{.20}B_{.45}N_{.35}$ | >600 | |
| $W_{.24}B_{.39}N_{.37}$ | >600 | >700 |
| $W_{.29}B_{.32}N_{.39}$ | >600 | >700 |
| $W_{.24}B_{.52}N_{.24}$ | >600 | <900 |
| $W_{.23}B_{.49}N_{.28}$ | ~700 | |

Certain film compositions remain partially amorphous even after a one-hour anneal at 900° C. This compares very well with ternary diffusion barriers deposited by PVD techniques.

To test these materials' resistance to Cu diffusion, diode test structures were used. The thickness of the barrier was 1000 Å and the samples were held at temperature for 30 minutes. The results are summarized in Table 1. After anneal, the reverse leakage was measured on eight diodes per composition. The best result obtained was the prevention of diffusion up to 700° C. Films with good barrier properties had compositions slightly more boron rich than the intersection of the W—BN tie line to the band of ternary compositions able to be accessed. The resistivities of these films are roughly 1000 $\mu\Omega$-cm. While this diffusion barrier performance is not as good as the results obtained with certain of the ternary PVD films, it is very respectable and more than adequate in terms of the thermal budget envisioned for advanced Cu and Al metallization processes.

A range of different W—B—N compositions in a band of compositions roughly between 20 and 40% W were produced using CVD. The deposition temperature was low, the precursors used are well accepted by the industry and the deposition rates were high for a diffusion barrier application. Film resistivities ranged from 200 to 20000 $\mu\Omega$-cm, the films with the best barrier properties having about 1000 $\mu\Omega$-cm resistivities. The results indicate that these materials, deposited by CVD, have barrier properties similar to those deposited by physical deposition techniques. The barrier characteristics observed using diode test structures are more than adequate for future advanced Al or Cu applications.

The preceding examples can be repeated with similar success by substituting the generically or specifically described reactants and/or operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A method of depositing a ternary, refractory based thin film on a substrate, the method comprising the steps of:
   a) providing a precursor source of tungsten comprising $WF_6$;
   b) providing a precursor source of an element selected from the group consisting of silicon and boron;
   c) providing a precursor source of nitrogen; and
   d) depositing, by chemical vapor deposition employing the three precursors, a thin film selected from the group consisting of W—Si—N and W—B—N.

2. The method of claim 1 additionally comprising the step of providing a substantially inert carrier gas.

3. The method of claim 2 wherein the step of providing a carrier gas comprises providing argon.

4. The method of claim 1 wherein the step of providing a precursor source of an element selected from the group consisting of silicon and boron comprises providing a compound selected from the group consisting of $SiH_4$, $Si_2H_6$, and $B_2H_6$.

5. The method of claim 1 wherein the step of providing a precursor source of nitrogen comprises providing $NH_3$.

6. The method of claim 1 wherein the depositing step comprises conducting the chemical vapor deposition at a temperature between approximately 200 degrees C. and approximately 400 degrees C.

7. The method of claim 6 wherein the depositing step comprises conducting the chemical vapor deposition at approximately 350 degrees C.

8. The method of claim 1 wherein the depositing step results in a film having a step coverage of the substrate of greater than approximately 80 percent.

9. The method of claim 8 wherein the depositing step results in a film having a step coverage of the substrate of approximately 100 percent.

10. The method of claim 1 wherein the depositing step results in a film having a resistivity of between approximately 200 and 20,000 $\mu\Omega$-cm.

11. The method of claim 1 wherein the depositing step results in a film which is substantially uniform through its bulk.

12. The method of claim 1 wherein the depositing step results in a film which comprises between approximately 20 percent and 60 percent tungsten.

* * * * *

UNITED STATES PATENT AND TRADEMARK OFFICE
CERTIFICATE OF CORRECTION

PATENT NO.   : 5,916,634
DATED        : June 29, 1999
INVENTOR(S)  : James G. Fleming, et al.

It is certified that error appears in the above-identified patent and that said Letters Patent is hereby corrected as shown below:

On the title page, add Assignee:

Item [73] California Institute of Technology,
Pasadena, CA

Signed and Sealed this

First Day of August, 2000

*Attest:*

*Attesting Officer*

Q. TODD DICKINSON

*Director of Patents and Trademarks*